United States Patent
Luo et al.

(10) Patent No.: US 7,897,468 B1
(45) Date of Patent: Mar. 1, 2011

(54) DEVICE HAVING SELF-ALIGNED DOUBLE GATE FORMED BY BACKSIDE ENGINEERING, AND DEVICE HAVING SUPER-STEEP RETROGRADED ISLAND

(75) Inventors: Zhijiong Luo, Hopewell Junction, NY (US); Qingqing Liang, Hopewell Junction, NY (US); Haizhou Yin, Hopewell Junction, NY (US); Huilong Zhu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/556,604

(22) Filed: Sep. 10, 2009

(51) Int. Cl.
  *H01L 21/336* (2006.01)
(52) U.S. Cl. .................. 438/283; 257/E21.421
(58) Field of Classification Search ......... 438/283; 257/E21.421
  See application file for complete search history.

(56) References Cited

U.S. PATENT DOCUMENTS

| 6,207,530 | B1 * | 3/2001 | Hsu et al. | 438/404 |
| 6,335,214 | B1 * | 1/2002 | Fung | 438/30 |
| 2006/0022264 | A1 * | 2/2006 | Mathew et al. | 257/331 |
| 2006/0022275 | A1 * | 2/2006 | Ilicali et al. | 257/366 |
| 2006/0027881 | A1 * | 2/2006 | Ilicali et al. | 257/401 |

* cited by examiner

*Primary Examiner* — Lex Malsawma
(74) *Attorney, Agent, or Firm* — Scully, Scott, Murphy & Presser PC; H. Daniel Schnurmann

(57) ABSTRACT

A method of forming a dual gate semiconductor device is provided that includes providing a substrate having a first semiconductor layer and a second semiconductor layer, in which a first gate structure is formed on the second semiconductor layer. The second semiconductor layer and the first semiconductor layer are etched to expose the substrate using the first gate structure as an etch mask. A remaining portion of the first semiconductor layer is present underlying the first gate structure having edges aligned to the edges of the first gate structure. An epitaxial semiconductor material is formed on exposed portions of the substrate. The substrate and the remaining portion of the first semiconductor layer are removed to provide a recess having edges aligned to the edges of the first gate structure, and a second gate structure is formed in the recess. A method of forming a retrograded island is also provided.

21 Claims, 9 Drawing Sheets

US 7,897,468 B1

DEVICE HAVING SELF-ALIGNED DOUBLE GATE FORMED BY BACKSIDE ENGINEERING, AND DEVICE HAVING SUPER-STEEP RETROGRADED ISLAND

BACKGROUND

The present disclosure relates to the fabrication of metal oxide semiconductor field effect transistor (MOSFET) devices, and in particular to a method of fabricating dual gate MOSFET devices.

Over the past twenty-five years or so, the primary challenge of very large scale integration (VLSI) has been the integration of an ever-increasing number of MOSFET devices with high yield and reliability. This was achieved mainly by scaling down MOSFET channel lengths without excessive short-channel effects. Short-channel effects are the decrease in threshold voltage ($V_t$) in short-channel devices due to two-dimensional electrostatic charge sharing between the gate and the source/drain regions. Prior attempts to improve short-channel effects include forming retrograded wells by implanting a high concentration of counter-dopant at the channel and source/drain extensions. The high concentration of counter-dopant at the PN junctions (source/channel interface, channel/drain interface) of the device disadvantageously result in increased device leakage. Double-gated MOSFETs and MOSFETs with a top gate and a backside ground plane are more immune to short-channel effects than single gate MOSFETs to short-channel effects.

SUMMARY

A method of forming a dual gate semiconductor device is provided that produces a structure in which a first gate, i.e., upper gate, is aligned to a second gate, i.e., back gate. In one embodiment, the method of providing a dual gate semiconductor device includes providing a substrate having a first semiconductor layer and a second semiconductor layer present on the substrate. A first gate structure is formed on the second semiconductor layer. The first semiconductor layer and the second semiconductor layer are then etched to expose the substrate using the first gate structure as an etch mask, wherein a remaining portion of the first semiconductor layer is present underlying the first gate structure. The edges of the remaining portions of the first semiconductor layer are aligned to the edges of the first gate structure. Epitaxial semiconductor material is grown on portions of the substrate that are exposed, and a source region and a drain region are formed in at least the epitaxial semiconductor material. The substrate and the remaining portion of the first semiconductor layer are removed to provide a recess having edges aligned to the edges of the overlying first gate structure. A second gate structure is then formed in the recess.

In another aspect, a method of forming a retrograded dopant island is provided that minimizes diffusion of the dopant that provides the retrograded dopant island. In one embodiment, the method of forming a retrograded dopant island includes providing a substrate having a first semiconductor layer and a second semiconductor layer. A first gate structure is formed on the second semiconductor layer. The second semiconductor layer and the first semiconductor layer are etched to expose the substrate using the first gate structure as an etch mask, wherein a remaining portion of the first semiconductor layer is present underlying the first gate structure. A first epitaxial semiconductor material is formed on the exposed portions of the substrate. A source region and drain region are formed in at least the first epitaxial semiconductor material. The substrate is removed to expose the first semiconductor layer. The first epitaxial semiconductor material is etched selective to the first semiconductor layer to provide first recesses adjacent to each sidewall of the first semiconductor layer. A dielectric layer is formed on the first recesses that are adjacent to each sidewall of the first semiconductor layer. The first semiconductor layer is removed to provide a second recess. A second epitaxial semiconductor material is formed within the second recess to provide the retrograded dopant island.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

A "gate structure" means a structure used to control output current (i.e. flow of carriers in the channel) of a semiconducting device through electrical or magnetic fields.

As used herein, the term "channel" is the region underlying the gate structure and between the source and drain of a semiconductor device that becomes conductive when the semiconductor device is turned on.

As used herein, the term "drain" means a doped region in semiconductor device located at the end of the channel, in which carriers are flowing out of the transistor through the drain.

As used herein, the term "source" is a doped region in the semiconductor device, in which majority carriers are flowing into the channel.

A "retrograded dopant island" denotes a doped region underlying the channel of a semiconductor device, in which the doped region is of the same conductivity as the channel, but has a dopant concentration at least one order of magnitude greater than the channel.

"Epitaxial growth and/or deposition" means the growth of a semiconductor material on a deposition surface of a semiconductor material, in which the semiconductor material being grown has the same crystalline characteristics of the deposition surface of the semiconductor material.

The term "direct physical contact" means that a first element, such as a first structure, and a second element, such as a second structure, are connected without any intermediary conducting, insulating or semiconductor layers at the interface of the two elements.

The terms "overlying", "atop", "positioned on" or "positioned atop" mean that a first element, such as a first structure, is present on a second element, such as a second structure, wherein intervening elements, such as an interface structure, e.g., interface layer, may be present between the first element and the second element.

FIGS. 1-6 depict one embodiment of a method for forming a dual gate semiconductor device (also referred to as a double gate semiconductor device), in which a first gate structure, i.e., upper gate structure, is self-aligned to a second gate structure, i.e., back gate structure.

Figure 1:
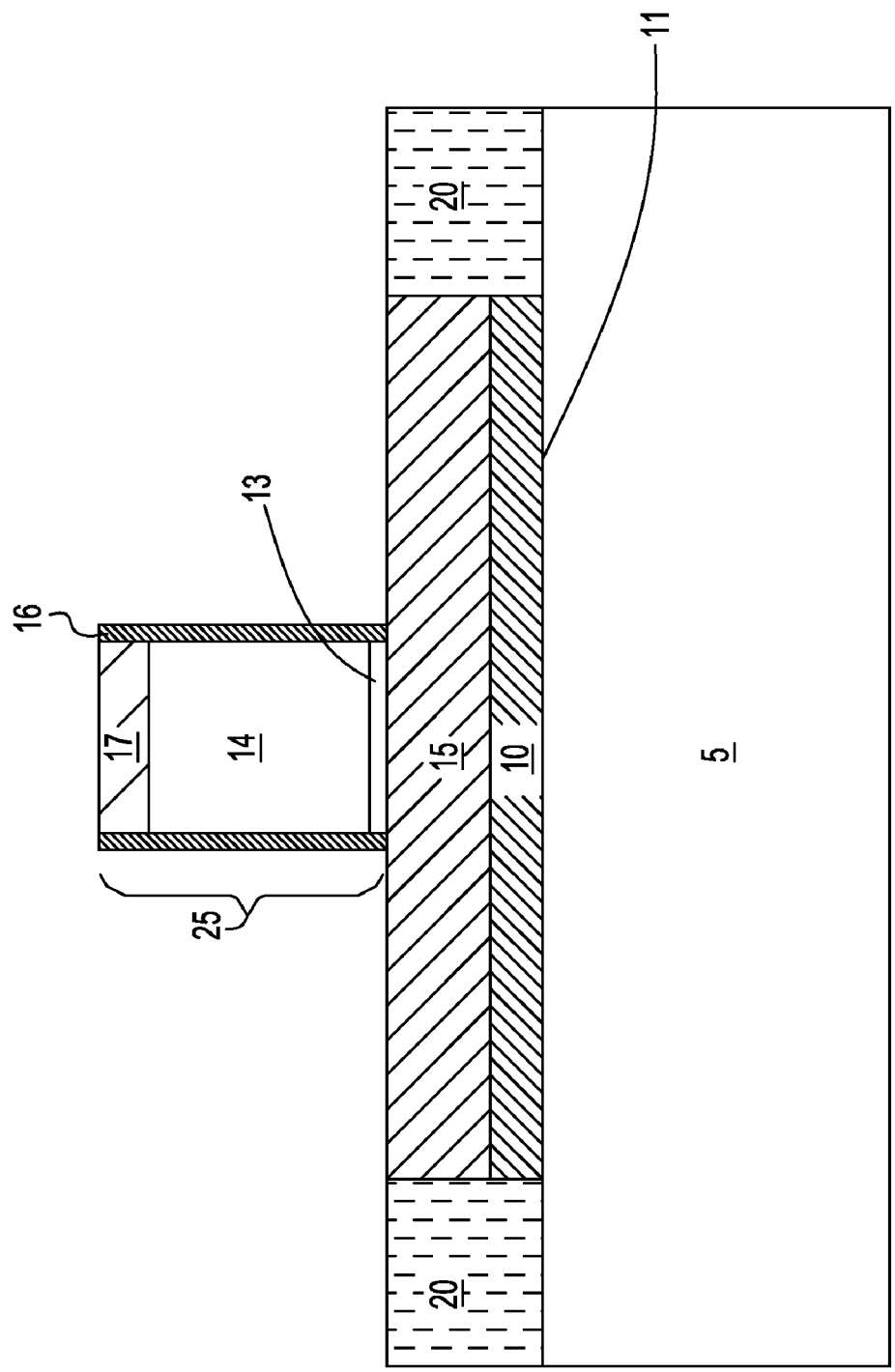
FIG. 1 is a side cross-sectional view depicting a substrate having a first semiconductor layer present on a first surface of the substrate and a second semiconductor layer present on the first semiconductor layer, in which a first gate structure is present on the second semiconductor layer, in accordance with one embodiment of the present invention.

FIG. 1 depicts one embodiment of an initial structure that may be utilized to provide a method of forming a dual gate semiconductor device, in which the first gate structure, i.e., upper gate structure, is self-aligned to the second gate structure, i.e., back gate structure. The initial structure typically includes a substrate 5 having a first semiconductor layer 10 present on a first surface 11 of the substrate 5 and a second semiconductor layer 15 present on the first semiconductor layer 10.

The substrate 5 may include, but is not limited to Si-containing materials, GaAs, InAs and other like semiconductors. Si-containing materials as used to provide the substrate 5 include, but are not limited to Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures.

The first semiconductor layer 10 may be a silicon-containing layer. The term "Si-containing layer" as used herein denotes any semiconductor material that includes silicon. Illustrative examples of various Si semiconductor materials that can be employed in the present invention include, but are not limited to Si, SiGe, SiGeC, SiC and other like Si-containing materials. The first semiconductor layer 10 may also be Ge, Ge alloys, GaAs, InAs, InP as well as other III/V and II/VI compound semiconductors. Combinations of the aforementioned semiconductor materials can also be used. In one embodiment, the first semiconductor layer 10 is silicon germanium.

The first semiconductor layer 10 may be formed on the substrate 5 using a deposition method, such as chemical vapor deposition (CVD) or physical vapor deposition. "Chemical Vapor Deposition" is a deposition process in which a deposited species is formed as a result of a chemical reaction between gaseous reactants at greater than room temperature, wherein a solid product of the reaction is deposited on the surface on which a film, coating, or layer of the solid product is to be formed. Variations of CVD processes suitable for providing the conformally deposited first semiconductor layer 10 include, but are not limited to Atmospheric Pressure CVD (APCVD), Low Pressure CVD (LPCVD), Plasma Enhanced CVD (EPCVD), Metal-Organic CVD (MOCVD), and combinations thereof. It is noted that the first semiconductor layer 10 is not limited to be formed by deposition methods, as growth methods have also been contemplated for forming the first semiconductor layer 10.

In one embodiment, the first semiconductor layer 10 may have a thickness ranging from 5 nm to 150 nm. In another embodiment, the first semiconductor layer 10 may have a thickness ranging from 10 nm to 100 nm. In an even further embodiment, the first semiconductor layer 10 may have a thickness ranging from 25 nm to 75 nm.

In one example, the first semiconductor layer 10 is silicon germanium that is formed by chemical vapor deposition, and has a thickness ranging from 2 nm to 50 nm.

The second semiconductor layer 15 is typically composed of a semiconductor material having a different composition than the first semiconductor material 10. The second semiconductor layer 15 may be a silicon-containing layer. Examples of silicon containing materials suitable for the second semiconductor layer 15 include, but are not limited to Si, SiGe, SiGeC, SiC and other like Si-containing materials. The second semiconductor layer 15 may also be Ge, Ge alloys, GaAs, InAs, InP as well as other III/V and II/VI compound semiconductors. Combinations of the aforementioned semiconductor materials can also be used as the second semiconductor layer.

The second semiconductor layer 15 may be formed using growth or deposition methods. In one embodiment, the second semiconductor layer 15 may be composed of silicon and is formed using an epitaxial growth process. In one example, epitaxial Si growth may occur when silicon atoms are deposited on a silicon-containing surface in a CVD reactor.

A number of different sources may be used for the deposition of epitaxial silicon. Silicon tetrachloride (SiCl₄) is one source of silicon for epitaxial deposition. Silicon tetrachloride reacts with a Si surface in the following manner:

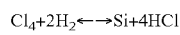
$$Cl_4 + 2H_2 \leftrightarrows Si + 4HCl$$

The temperature for epitaxial silicon deposition typically ranges from about 600° C. to about 900° C.

Another epitaxial Si source is silane (SiH$_4$). The silane epitaxial growth reaction is as follows:

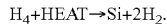

Dichlorosilane (SiH$_2$Cl$_2$) may also be used as the epitaxial Si source. Dichlorosilane is also a low temperature source. The dichlorosilane epitaxial growth reaction is as follows:

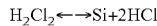

In some embodiments of the invention, the second semiconductor layer 15 may be formed using a deposition process, such as chemical vapor deposition (CVD) or physical vapor deposition (PVD).

The second semiconductor layer 15 may have a thickness ranging from 5 nm to 150 nm. In another embodiment, the second semiconductor layer 15 may have a thickness ranging from 10 nm to 100 nm. In an even further embodiment, the second semiconductor layer 15 may have a thickness ranging from 25 nm to 75 nm.

In one example, the second semiconductor layer 15 is silicon formed using epitaxial deposition, in which second semiconductor layer 15 and has a thickness ranging from 50 nm to 100 nm.

In one embodiment, isolation regions 20 may be present extending through the second semiconductor layer 15 and the first semiconductor layer 10 terminating on or extending into the substrate 5. The isolation regions 20 may be provided by a trench filled with an insulating material, such as an oxide, nitride, or oxynitride. In one embodiment, the isolation regions 20 are shallow trench isolation (STI) regions. In one example, the shallow trench isolation region is formed by etching a trench into the first and second semiconductor layers 10, 15 terminating on the first surface 11, i.e., upper surface, of the substrate 5 utilizing a dry etching process, such as reactive-ion etching (RIE) or plasma etching. The trenches may optionally be lined with a liner material, e.g., an oxide. In one embodiment, chemical vapor deposition or another like deposition process may be used to fill the trench with polysilicon or another like STI dielectric material, such as an oxide. The STI dielectric may optionally be densified after deposition. A planarization process, such as chemical-mechanical polishing (CMP), may optionally be used to provide a planar structure. Dielectric materials as described throughout this disclosure in some embodiments denote a material having a room temperature conductivity of less than about $10^{-10} (\Omega\text{-m})^{-1}$.

Still referring to FIG. 1, the first gate structure 25 may be formed overlying the substrate 5 utilizing deposition, lithography and etching processes. More specifically, and in one embodiment, the first gate structure 25 is provided atop the second semiconductor layer 15 by depositing a first gate dielectric 13 followed by a first gate conductor 14 to provide a gate stack. In a following process step, the gate stack is patterned using photolithography and etching to produce the first gate structure 25. For example, following the deposition of the first gate dielectric 13 and first gate conductor 14, an etch mask is formed atop the first gate conductor 14 protecting the portion of the layered stack that provides the first gate structure 25, wherein the portions exposed by the etch mask are removed by an anisotropic etch process, such as a reactive ion etch. Reactive ion etch (RIE) is a form of plasma etching, in which the surface to be etched is placed on the RF powered electrode and takes on a potential that accelerates an etching species, which is extracted from a plasma, towards the surface to be etched, wherein a chemical etching reaction takes place in the direction normal to the surface being etched. In one embodiment, the etch mask may be provided by a patterned photoresist layer, or may be provided by a hard mask, such as a dielectric cap 17.

The first gate dielectric 13 of the first gate structure 25 may be composed of an oxide material. Suitable examples of oxides that can be employed as the first gate dielectric 13 include, but are not limited to SiO$_2$, Al$_2$O$_3$, ZrO$_2$, HfO$_2$, Ta$_2$O$_3$, TiO$_2$, perovskite-type oxides and combinations and multi-layers thereof. The first gate dielectric 13 may also be composed of a nitride, oxynitride, or a combination thereof including said oxide or the first gate dielectric 13 may be composed of multiple layers of the aforementioned materials. The first gate conductor 14 of the gate stack may be composed of a silicon containing material, which may be polysilicon. In another embodiment, the first gate conductor 14 is composed of single crystal Si, SiGe, SiGeC or combinations thereof. In another embodiment, the first gate conductor 14 may be a metal and/or silicide. In other embodiment, the first gate conductor 14 is comprised of multilayered combinations of said conductive materials. The first gate structure 25 may also comprise a dielectric cap 17 present atop the first gate conductor 14, which may be composed of any dielectric material, including but not limited to oxides, nitrides or oxynitrides.

In one embodiment, a first spacer 16 may be formed in direct physical contact with the sidewall of the first gate structure 25. The first spacer 16 may comprise a dielectric such as a nitride, oxide, oxynitride, or a combination thereof. In one embodiment, in which the first spacer 16 is composed of an oxide, such as silicon oxide, the first spacer 16 may be formed by thermal oxidation. In another embodiment, in which the first spacer 16 is composed of a nitride, such as silicon nitride, the first spacer 16 may be formed using deposition and etch processes. In one example, the first spacer 16 has a width of less than 10 nm, typically ranging from 2 nm to 5 nm. It is noted that the first spacer 16 is optional, and embodiments are contemplated in which the first spacer 16 is not present.

Figure 2:
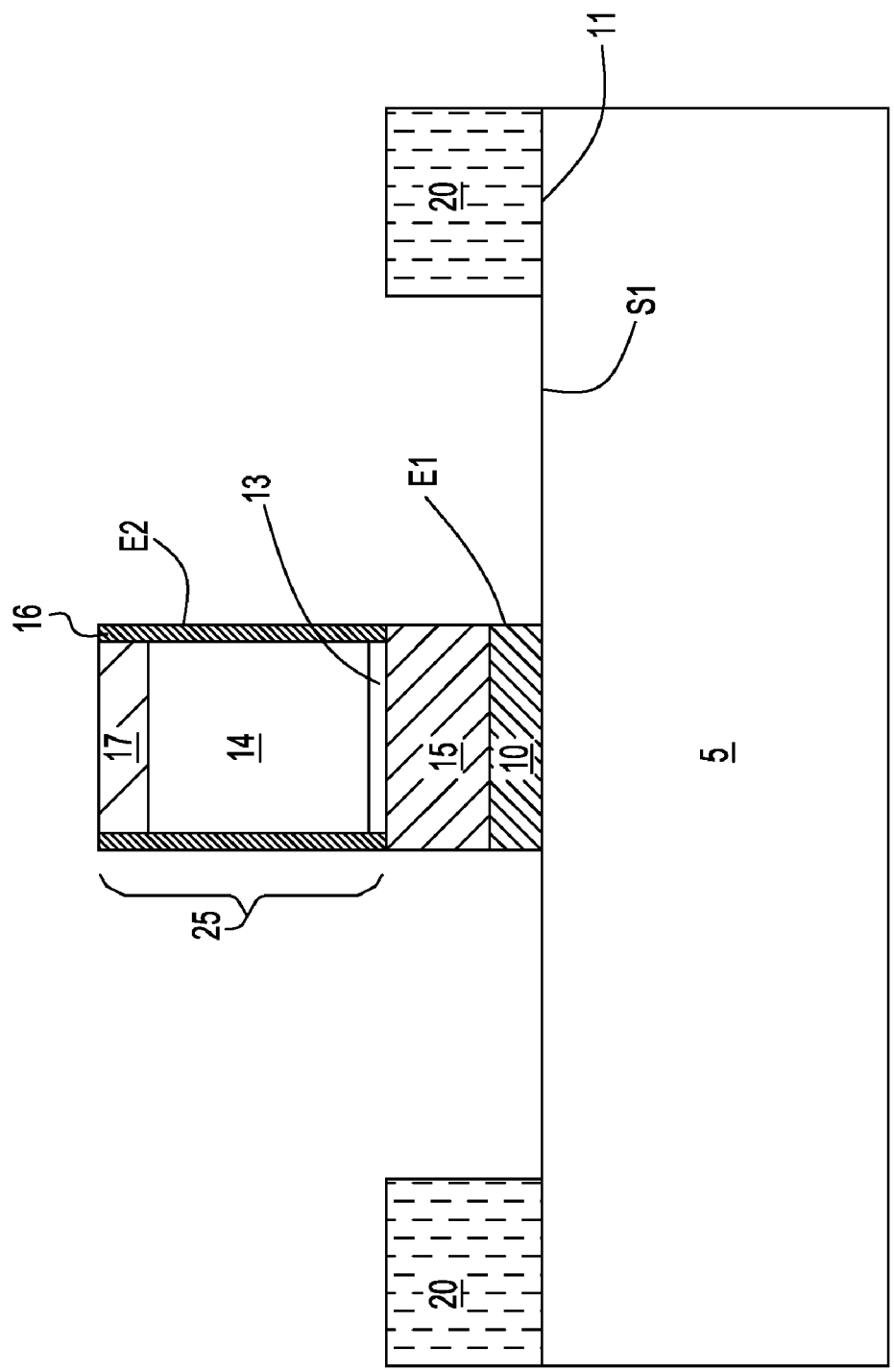
FIG. 2 is a side cross-sectional view depicting etching the second semiconductor layer and the first semiconductor layer to expose the substrate using the first gate structure as an etch mask, in accordance with one embodiment of the present invention.

FIG. 2 depicts one embodiment of etching the second semiconductor layer 15 and the first semiconductor layer 10 to expose the substrate 5 using the first gate structure 25 as an etch mask, wherein a remaining portion of the first semiconductor layer 10 is present underlying the first gate structure 25. During the etch step, the first gate structure 25 functions as an etch mask. The width of the portion of the second semiconductor layer 15 that is removed by this etch extends from the edge E2 of the first gate structure 25 to the isolation region 20. An anisotropic etch process may remove the portions of the second semiconductor layer 15 that are adjacent to the first gate structure 25 and extend to the isolation region 20, in which the etch chemistry of the etch process removes the second semiconductor layer 15 selective to the first gate structure 25. As used herein, the term "anisotropic etch process" denotes a material removal process in which the etch rate in the direction normal to the surface to be etched is much higher than in the direction parallel to the surface to be etched. One example of an anisotropic etch process is reactive ion etching (RIE). Alternatively, the anisotropic etch process may be provided by laser ablation.

The etch chemistry that removes the second semiconductor layer 15 is typically selective to the isolation region 20, and the first spacer 16 and the dielectric cap 17 of the gate structure 25. The first semiconductor layer 10 may be etched by the same etch chemistry that removes the second semiconductor layer 15, or the first semiconductor layer 10 may be removed by a different etch chemistry that removes the second semiconductor layer 15 selective to the first semiconductor layer 10, the first spacers 16 and the dielectric cap 17. In one embodiment, the etch process that removes the first semiconductor layer 10 terminates on the first surface 11, i.e., upper surface, of the substrate 5 to provide an exposed surface S1 of the substrate 5.

As illustrated in FIG. 2, the edges E1 of the remaining portions of the first semiconductor layer 10 are aligned to the edges E2 of the first gate structure 25. In the embodiment depicted in FIG. 2, the edges E2 of the first gate structure 25 that are aligned to the edges E1 of the remaining portion of the first semiconductor layer 10, are the outer sidewalls of the first spacer 16. In embodiment in which the first spacer 16 is not present, the edges E2 of the first gate structure 25 that are aligned to the edges E1 of the remaining portion of the first semiconductor layer 10, are the outer sidewalls of the gate conductor 14.

Figure 3:
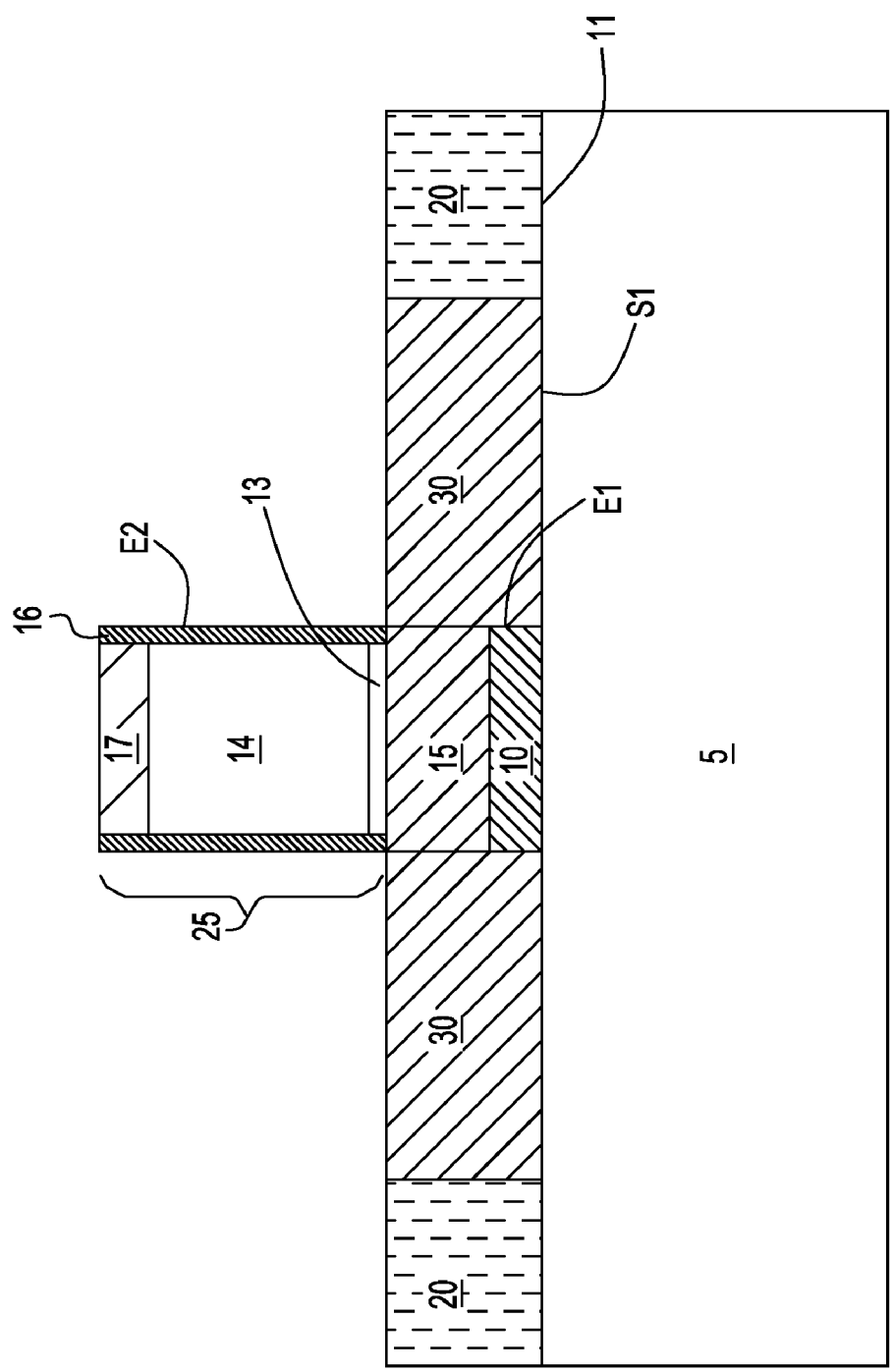
FIG. 3 is a side cross-sectional view depicting one embodiment of forming epitaxial semiconductor material on exposed portions of the substrate, in accordance with the present invention.

FIG. 3 depicts forming an epitaxial semiconductor material 30 on exposed portions, e.g., exposed surface S1, of the substrate 5. The epitaxial semiconductor material 30 is formed using an epitaxial growth process similar to the epitaxial growth process for forming the second semiconductor layer 15, as described with reference to FIG. 1. The epitaxial semiconductor material 30 may be a silicon-containing material. Some examples of semiconductor compositions suitable for the epitaxial semiconductor material 30 include, but are not limited to single crystal Si, SiGe, SiGeC or combinations thereof. In one embodiment, the growth process to provide the epitaxial semiconductor material 30 is continued until the upper surface of the epitaxial semiconductor material 30 is coplanar with the upper surface of the second semiconductor layer 15 on which the first gate structure 25 is present.

Figure 4:
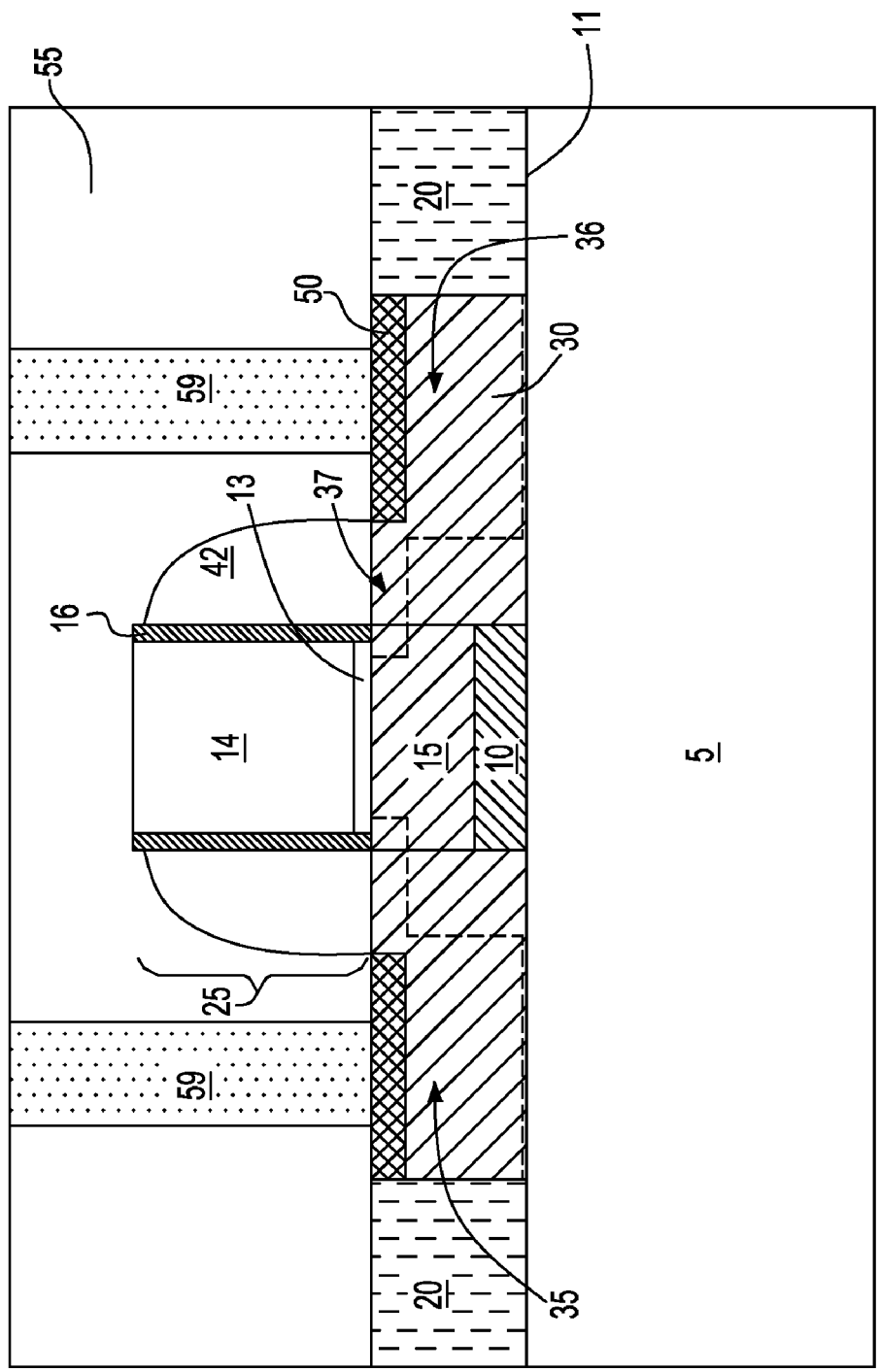
FIG. 4 is a side cross-sectional view depicting one embodiment of forming source region and a drain region in at least the epitaxial semiconductor material, and forming contacts to the source region and the drain region.

FIG. 4 depicts forming a source region 35 and a drain region 36 in at least the epitaxial semiconductor material 30. In one embodiment, extension regions 37 are formed using an ion implantation process step. More specifically, when forming p-type extension regions a typical dopant species is boron or $BF_2$. Boron may be implanted utilizing implant energies ranging from 0.2 keV to 3.0 keV with an implant dose ranging from $5\times10^{14}$ atoms/cm$^2$ to $5\times10^{15}$ atoms/cm$^2$. $BF_2$ may be implanted utilizing implant energies ranging from 1.0 keV to 15.0 keV and a dose ranging from $5\times10^{14}$ atoms/cm$^2$ to $5\times10^{15}$ atoms/cm$^2$. A typical implant for the n-type extension regions is arsenic. The n-type extension regions can be implanted with arsenic using implant energies ranging from 1.0 keV to 10.0 keV with a dose ranging from $5\times10^{14}$ atoms/cm$^2$ to $5\times10^{15}$ atoms/cm$^2$.

A second set of spacers (second spacers 42) are formed laterally abutting the first spacers 16. Each spacer of the second set of spacers has a width ranging from 50.0 nm to 100.0 nm. The second spacers 42 may be composed of an oxide, i.e. $SiO_2$. In yet other embodiments, the second spacers 42 may be composed of a nitride or an oxynitride material. The second spacers 42 may be formed by deposition and etch processes. For example, a conformal oxide layer may be deposited using conventional deposition processes, including, but not limited to chemical vapor deposition (CVD), plasma-assisted CVD, and low-pressure chemical vapor deposition (LPCVD). The conformal oxide layer may then be etched to provide the second spacers 42 using an anisotropic plasma etch procedure such as, but not limited to reactive ion etch.

The source region 35 and drain region 36 are then implanted. Typical implant species for the n-source/drain region may be phosphorus or arsenic. The n-type source/drain region may be implanted with phosphorus using an energy ranging from 3.0 keV to 15.0 keV with a dose ranging from $1\times10^{15}$ atoms/cm$^2$ to $7\times10^{15}$ atoms/cm$^2$. The n-type source/drain region may be implanted with arsenic using an energy ranging from 6.0 keV to 30.0 keV with a dose ranging from $1\times10^{15}$ atoms/cm$^2$ to $7\times10^{15}$ atoms/cm$^2$. Typical implant species for the p-type region maybe boron or $BF_2$. The p-type source/drain region can be implanted with boron utilizing an energy ranging from 1.0 keV to 8.0 keV with a dose ranging from $1\times10^{15}$ atoms/cm$^2$ to $7\times10^{15}$ atoms/cm$^2$. The p-type source/drain region may also be implanted with $BF_2$ with an implant energy ranging from 5.0 keV to 40.0 keV and a dose ranging from $1\times10^{15}$ atoms/cm$^2$ to $7\times10^{15}$ atoms/cm$^2$.

Still referring to FIG. 4, silicide regions 50 may be formed on the source region 35 and drain region 36. Silicide formation typically requires depositing a refractory metal, such as Ni or Ti, onto the surface of a Si-containing material, such as the epitaxial semiconductor material 30. Following deposition, the structure is subjected to an annealing step using conventional processes such as, but not limited to, rapid thermal annealing. During thermal annealing, the deposited metal reacts with Si forming a metal silicide. The non-reacted metal may be removed.

Following silicide formation, a layer of dielectric material 55 is blanket deposited atop the entire structure and planarized. The blanket dielectric may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, $\alpha$-C:H). Additional choices for the blanket dielectric 55 include: any of the aforementioned materials in porous form, or in a form that changes during processing to or from being porous and/or permeable to being non-porous and/or non-permeable. The blanket layer of dielectric material 55 may be formed by various methods well known to those skilled in the art, including, but not limited to spinning from solution, spraying from solution, chemical vapor deposition (CVD), plasma enhanced CVD (PECVD), sputter deposition, reactive sputter deposition, ion-beam deposition, and evaporation.

The blanket layer of dielectric material 55 is then patterned and etched to form via holes to the source region 35, drain region 36 and optionally, the gate conductor 14 (not shown) of the structure. Following via formation, interconnects 59 are formed by depositing a conductive metal into the via holes using conventional processing, such as CVD or plating. The conductive metal may include, but is not limited to tungsten, copper, aluminum, silver, gold, and alloys thereof.

Figure 5:
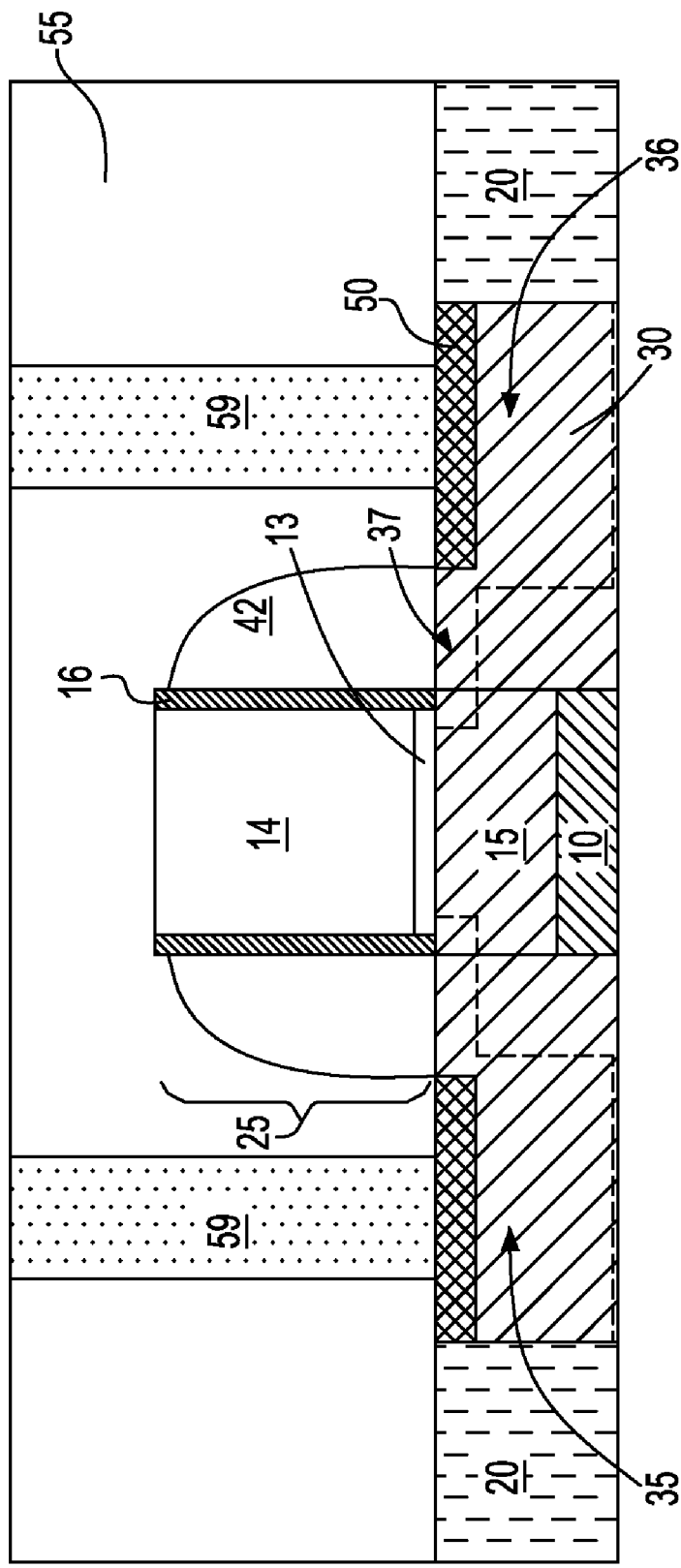
FIG. 5 is a side cross-sectional view depicting one embodiment of removing the substrate from the structure depicted in FIG. 4, in accordance with one embodiment of the present invention.

FIG. 5 depicts removing the substrate 5 from the structure depicted in FIG. 4, wherein removing the substrate 5 exposes the remaining portion of the first semiconductor layer 10. In one embodiment, the substrate 5 may be removed by an etch process, such as a dry etch process, e.g., RIE, or a wet etch process. In another embodiment, the substrate 5 may be removed using planarization. Planarization is a material removal process that employs at least mechanical forces, such as frictional media, to produce a planar surface. One example of planarization suitable for removing the substrate 5 is chemical mechanical planarization (CMP). Chemical mechanical planarization (CMP) is a material removal process using both chemical reactions and mechanical forces to remove material and planarize a surface. In an even further embodiment, the substrate 5 is removed using separation by ion implantation.

Figure 6:
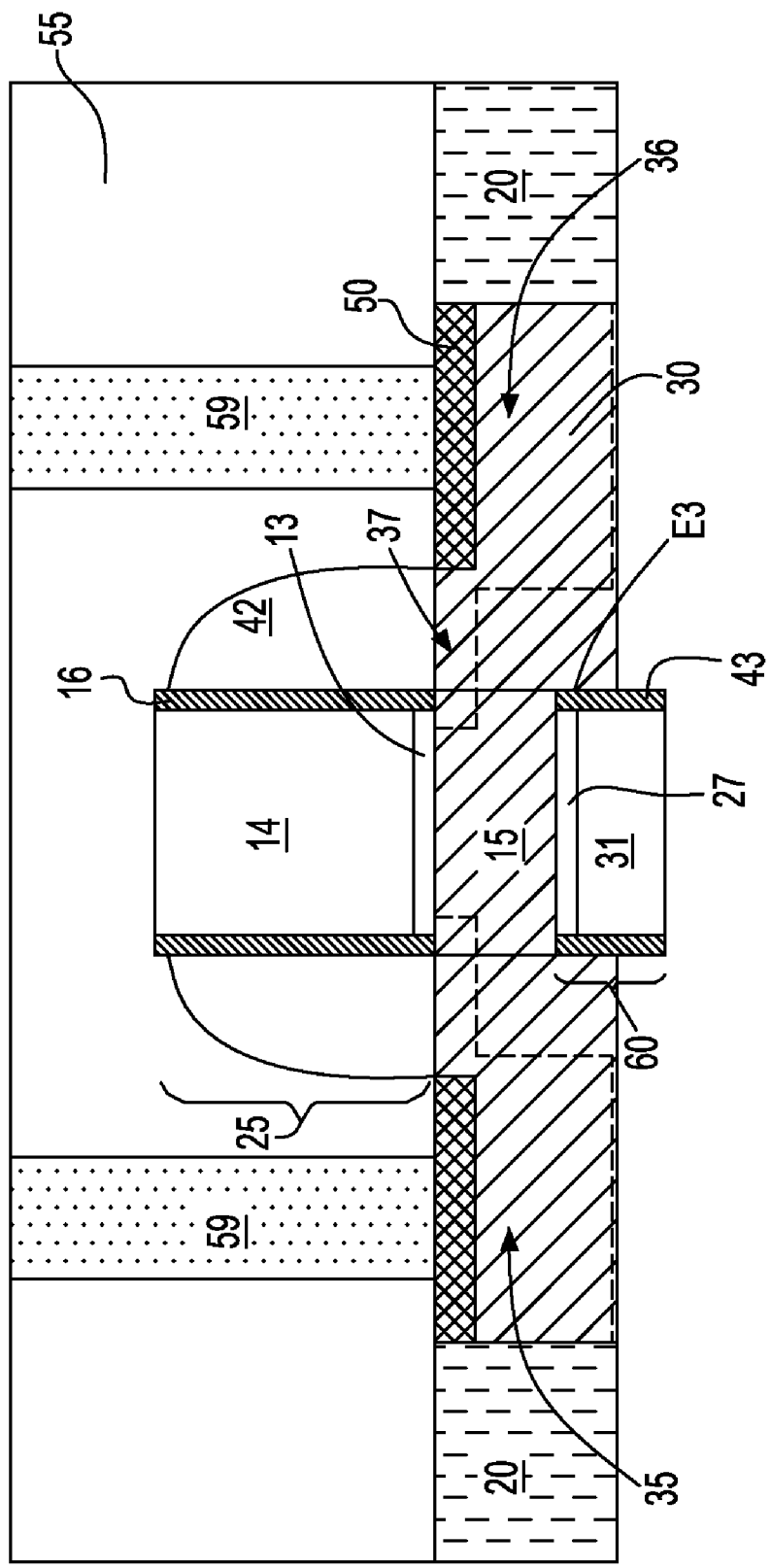
FIG. 6 depicts a side cross-sectional view depicting removing the remaining portion of the first semiconductor layer to provide a recess having edges aligned to the edges of the first gate structure, and forming a second gate structure in the recess, in accordance with one embodiment of the present invention.

FIG. 6 depicts removing the remaining portion of the first semiconductor layer 10 to provide a recess having edges E3 aligned to the edges E2 of the first gate structure 25, and forming a second gate structure 60 in the recess. The remaining portion of the first semiconductor layer 10 may be removed by one or more etching steps. In one embodiment, the remaining portion of the first semiconductor layer 10 is removed by a wet or dry etch process, which is selective to the epitaxial semiconductor material 30 and the isolation regions 20. In one embodiment, the remaining portion of the first semiconductor layer 10 is removed using an etch chemistry that is selective to the remaining portion of the second semiconductor layer 15. Removing the remaining portion of the first semiconductor layer 10 provides a recess having sidewalls defined by the epitaxial semiconductor material 30 and a base defined by the remaining portion of the second semiconductor layer 15.

A third set of spacers (third spacers 43) is formed on the sidewalls of the recess. Each spacer of the third set of spacers has a width of less than 10 nm, typically ranging from 2 nm to 5 nm. The third spacers 43 may be composed of an oxide, i.e., $SiO_2$. In yet another embodiment, the third spacers 43 may be composed of a nitride or an oxynitride material. The third spacers 43 may be formed deposition and etch processes. For example, a conformal dielectric layer may be deposited on the sidewalls and base of the recess using a deposition processes, including, but not limited to: chemical vapor deposition (CVD), plasma-assisted CVD, and low-pressure chemical vapor deposition (LPCVD). Following deposition, the conformal dielectric layer is then etched to produce the third spacers 43 using a plasma etch procedure such as, but not limited to: reactive ion etch.

Still referring to FIG. 6, a second gate dielectric 27 may be formed on the remaining portion of the second semiconductor layer 15 that provides the base of the recess by a thermal oxidation, nitridation or oxynitridation process. Alternatively, second gate dielectric 27 may be formed utilizing a deposition process. Combinations of the aforementioned processes may also be used in forming the second gate dielectric 27. The gate dielectric 27 may be composed of any dielectric including, but not limited to $SiO_2$; $Si_3N_4$; SiON; temperature sensitive high-k dielectrics such as $TiO_2$, $Al_2O_3$, $ZrO_2$, $HfO_2$, $Ta_2O_5$, $La_2O_3$; and other like oxides including perovskite-type oxides. The second gate dielectric 27 may also comprise any combination of the aforementioned dielectric materials. The second gate dielectric 27 may have a thickness ranging from 0.6 nm to 5.0 nm.

After the second gate dielectric 27 has been formed, a second gate conductor 31 is formed atop the second gate dielectric 27 by a deposition process (such as CVD, plasma-assisted CVD, plating, sputtering and etc.) followed by planarization. The second gate conductor 31 may comprise any conductive material including but not limited to polysilicon; a conductive elemental metal such as W, Cu, Pt, Ag, Au, Ru, Ir, Rh, and Re; alloys that include at least one of the aforementioned conductive elemental metals; silicides or nitrides that include at least one of the above-mentioned conductive elemental metals; and combinations thereof may be employed. When a combination of conductive elements is employed, an optional diffusion barrier material such as TaN or WN may be formed between the conductive materials.

The second gate conductor 31, the second gate dielectric 27, and the optional third spacers 43 provide the second gate structure 60. A back contact (not shown) may be formed in electrical contact with the second gate structure 60.

FIGS. 1-6 depict one embodiment of a method for forming a dual gate semiconductor device, in which the first gate structure 25, i.e., upper gate structure, is self-aligned to the second gate structure 60, i.e., back gate structure. The first and second gate structures 25, 60 are aligned to one another, because the first gate structure 25 dictates the location of the subsequently formed recess, in which the second gate structure 60 is subsequently formed in the recess.

Figure 7:
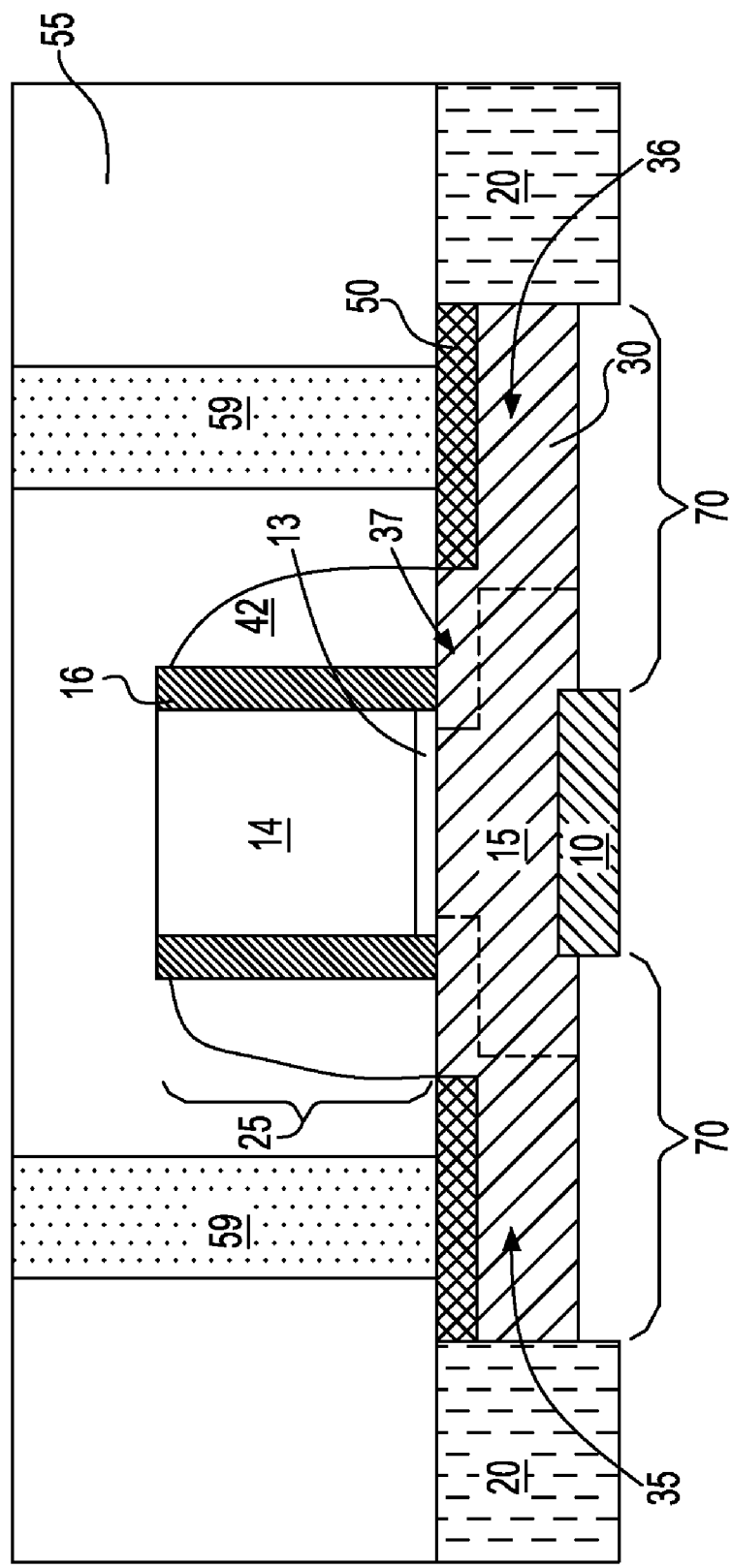
FIG. 7 depicts a side cross-sectional view of etching the structure depicted in FIG. 5 to remove a portion of the epitaxial semiconductor material and provide first recesses adjacent to each sidewall of the remaining portion of the first semiconductor layer, in accordance with one embodiment of the present invention.
Figure 8:
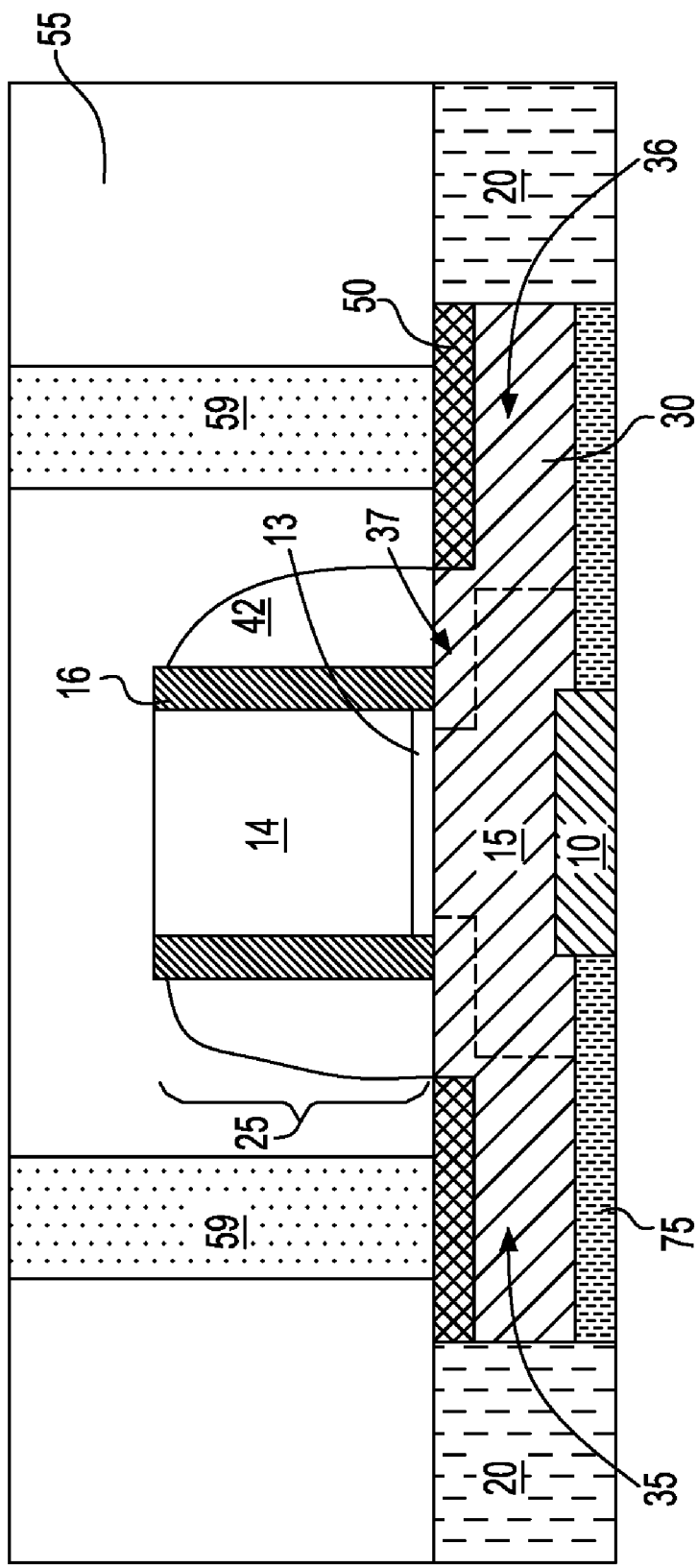
FIG. 8 depicts a side cross-sectional view of one embodiment of forming a dielectric layer on the first recesses that are adjacent to each sidewall of the remaining portion of the first semiconductor layer.
Figure 9:
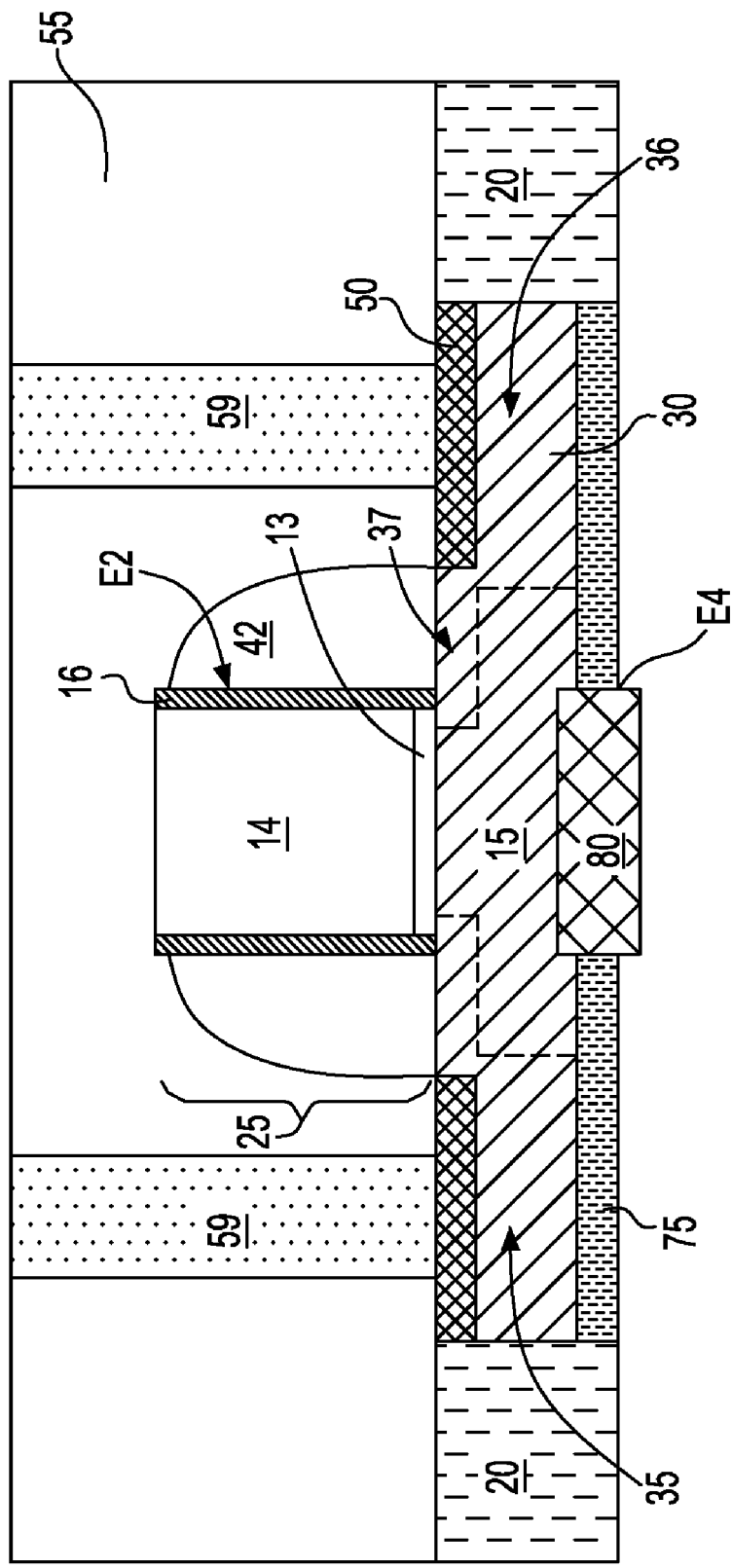
FIG. 9 depicts a side cross-sectional view of removing the first semiconductor layer to provide a second recess, and forming an in-situ doped second epitaxial semiconductor material within the second recess to provide a retrograded dopant island, in accordance with one embodiment of the present invention.

FIGS. 7-9 depict another embodiment of the invention, in which in-situ doped second epitaxial semiconductor material provides a retrograded dopant island 80 that is present aligned to the overlying first gate structure 25. In one embodiment, the retrograded dopant island 80 is a super steep retrograded island. The term "super steep retrograded island" denotes a doped region underlying the channel of the semiconductor device, in which the edge of the dopant region E4 is substantially aligned to the edge E2 of the overlying gate structure 25.

In one embodiment, the in-situ doped epitaxial semiconductor material is provided using backside engineering. By utilizing in-situ doping during the epitaxial growth process, the in-situ doped epitaxial semiconductor material has a sharp dopant profile (e.g. slope larger than a few nanometers per decade). In one embodiment, the method of forming a retrograded island begins by utilizing a similar process sequence that is described above for providing a double gate structure having self-aligned gate structures. The above description directed to FIGS. 1-5 are incorporated herein by reference.

FIG. 1 depicts an initial structure that may be used in a method of forming a retrograded dopant island, in which the initial structure is formed by providing a substrate 5 having a first semiconductor layer 10 present on the substrate 5 and a second semiconductor layer 15 present on the first semiconductor layer 15, wherein a gate structure 25 is formed on the second semiconductor layer 15. FIG. 2 depicts etching the second semiconductor layer 15 and the first semiconductor layer 10 to expose the substrate 5 using the first gate structure 25 as an etch mask, in which a remaining portion of the first semiconductor layer 10 is present underlying the first gate structure 25. FIG. 3 depicts forming a epitaxial semiconductor material 30 (hereafter referred to as first epitaxial semiconductor layer 30) on the exposed portions, i.e., exposure surface S1, of the substrate 5. FIG. 4 depicts forming source regions 35 and drain regions 36 in at least the first epitaxial semiconductor material 30. FIG. 5 depicts removing the substrate 5 to expose the remaining portion of the first semiconductor layer 10. Following source and drain region 35, 36 formation, and prior to the formation of the retrograded dopant island 80, at least the source and drain regions 35, 36 are activated by activation annealing using conventional processes such as, but not limited to: rapid thermal annealing, furnace annealing, flash lamp annealing or laser annealing. In one embodiment, activation anneal is conducted at a temperature ranging from 850° C. to 1350° C.

FIG. 7 depicts one embodiment of etching the structure depicted in FIG. 5 to remove a portion of the first epitaxial semiconductor material 30 and provide first recesses 70 adjacent to each sidewall of the remaining portion of the first semiconductor layer 10. In one embodiment, an anisotropic etch, such as reactive ion etching, provides the first recesses 70. In one embodiment, the etch process that provides the first recesses 70 includes an etch chemistry that removes the first epitaxial semiconductor material 30 selective to the remaining portion of the first semiconductor layer 10 and the isolation regions 20.

FIG. 8 depicts one embodiment of forming a dielectric layer 75 on the first recesses 70 that are adjacent to each sidewall of the remaining portion of the first semiconductor layer 10. In one embodiment, the dielectric layer 75 is composed of an oxide, nitride or oxynitride material. The dielectric layer 75 may be formed using deposition methods, such as chemical vapor deposition, or may be formed using growth methods, such as thermal oxidation. In one embodiment, the dielectric layer 75 is silicon oxide that is formed using a thermal oxidation method.

FIG. 9 depicts one embodiment of removing the first semiconductor layer 10 to provide a second recess, and forming an in-situ doped second epitaxial semiconductor material within the second recess to provide a retrograded dopant island 80. In one embodiment, the first semiconductor layer 10 is removed by a selective etch process having an etch chemistry that removes the first semiconductor layer 10 selective to the dielectric layer 75. The etch process may be an isotropic etch, such as a wet etch, or may be an anisotropic etch, such as reactive ion etching.

The retrograded dopant island 80 is provided by an epitaxially grown semiconductor material, i.e., second epitaxial semiconductor material. Removing the remaining portion of the first semiconductor layer 10 exposes a surface of the second semiconductor layer 15. Epitaxial growth is a selective deposition process. The fact that the process is selective means that the semiconductor material, i.e., silicon, grows only on exposed semiconductor materials, e.g., the silicon containing second semiconductor layer 15, and does not grow on dielectric or insulating surfaces, such as the oxide, nitride or oxynitride dielectric layer 75. The epitaxial growth process used to provide the second epitaxial material of the retrograded dopant island 80 is similar to the epitaxial growth process for forming the epitaxial semiconductor material 30, i.e., first epitaxial semiconductor material 30, as described with reference to FIG. 3, and the second semiconductor layer 15, as described with reference to FIG. 1.

During the epitaxial growth process used to provide the second epitaxial semiconductor material of the retrograded dopant island 80, a dopant is introduced to the second epitaxial semiconductor material. In one embodiment, the second epitaxial semiconductor material is silicon. Therefore, the second epitaxial material is in-situ doped. In one embodiment, the retrograded dopant island 80 comprises a first conductivity type dopant in a concentration that reduces the incidence of short-channel effects and is positioned within the second recess to ensure that the dopant concentration of the retrograded dopant island 80 does not substantially increase device leakage. The retrograded dopant island 80 is positioned underlying the device channel, in which the channel also has a first conductivity type dopant. The dopant concentration of the channel is at least one order of magnitude lower than the dopant concentration of the retrograded dopant island 80. The lower dopant concentration of the channel ensures that the charge carriers within the channel have a high mobility. The extension regions 37 and the source and drain regions 36, 37 are composed of a second conductivity type dopant. In one embodiment, the first conductivity type dopant is an n-type dopant, such as arsenic or phosphorus, and the second conductivity type dopant is a p-type dopant such as boron or indium. Conversely, if the first conductivity type dopant is a p-type dopant, the second conductivity type dopant is an n-type dopant.

In one embodiment, the dopant concentration of the retrograded dopant island 80 ranges from $5\times10^{18}$ atoms/cm$^3$ to $2\times10^{20}$ atoms/cm$^3$, typically being about $5\times10^{19}$ atoms/cm$^3$, and the channel has a dopant concentration ranging from $1\times10^{18}$ atoms/cm$^3$ to $5\times10^{18}$ atoms/cm$^3$, preferably being about $3\times10^{18}$ atoms/cm$^3$. The extension regions 37 may have a dopant concentration ranging from $5\times10^{19}$ atoms/cm$^3$ to $5\times10^{20}$ atoms/cm$^3$, typically being about $2\times10^{20}$ atoms/cm$^3$, and the source and drain regions 35, 36 may have a dopant concentration ranging from $1\times10^{20}$ atoms/cm$^3$ to $5\times10^{20}$ atoms/cm$^3$, typically being about $3\times10^{20}$ atoms/cm$^3$.

The present method of forming a retrograded dopant island 80 may utilize in-situ doping during epitaxial growth of the second epitaxial semiconductor material for the retrograded dopant island 80, which may occur after the anneal process steps that form the device silicide and activate the dopant regions, therefore reducing the sources for dopant diffusion of the retrograded dopant island 80. By reducing diffusion of the in-situ doped second epitaxial semiconductor, a super steep retrograded dopant island 80 may be provided having an abruptness equal to or less than 20 Å/decade, as measured from the edge E4 of the steep retrograded dopant island 80. In one embodiment, the edge E4 of the steep retrograded dopant island 80 is substantially aligned to the edge E2 of the gate structure 25.

While the invention has been particularly shown and described with respect to preferred embodiments thereof, it will be understood by those skilled in the art that the foregoing and other changes in form and details may be made therein without departing from the spirit and scope of the present invention.

What is claimed is:

1. A method of forming a dual gate semiconductor device comprising:
   providing a substrate having a first semiconductor layer and a second semiconductor layer present on the substrate, wherein a first gate structure is present on the second semiconductor layer;
   etching the second semiconductor layer and the first semiconductor layer to expose the substrate using the first gate structure as an etch mask, wherein a remaining portion of the first semiconductor layer is present underlying the first gate structure, and wherein edges of the remaining portion of the second semiconductor layer are aligned to edges of the first gate structure;
   forming an epitaxial semiconductor material on exposed portions of the substrate;
   forming a source region and a drain region in at least the epitaxial semiconductor material;
   removing the substrate and the remaining portion of the first semiconductor layer to provide a recess having edges aligned to the edges of the first gate structure; and
   forming a second gate structure in the recess.

2. The method of claim 1, wherein the first semiconductor layer comprises a SiGe-containing layer, the second semiconductor layer comprises a silicon-containing layer, and the epitaxial semiconductor material comprises a silicon-containing layer.

3. The method of claim 2, wherein the first gate structure is formed by:
   depositing a first gate dielectric on the second semiconductor layer;
   depositing a first gate conductor on the first gate dielectric;
   forming an etch mask overlying the first gate conductor; and
   etching the first gate conductor and the first gate dielectric selective to the etch mask to provide the first gate structure.

4. The method of claim 3, wherein the first gate structure further comprises first spacers contacting sidewalls of the first gate conductor and the first gate dielectric.

5. The method of claim 2, wherein the etching of the first semiconductor layer and the second semiconductor layer comprises an anisotropic etch process.

6. The method of claim 2, wherein the forming of the epitaxial semiconductor material on the exposed portions of the substrate comprises an epitaxial growth process, wherein the substrate comprises silicon.

7. The method of claim 2, wherein an upper surface of the epitaxial semiconductor material is substantially coplanar with a surface of a remaining portion of the second semiconductor layer that is in direct contact with the first gate structure.

8. The method of claim 2, wherein the removing of the substrate comprises etching, planarization or separation by ion implantation.

9. The method of claim 2, wherein the removing of the remaining portion of the first semiconductor layer comprises an isotropic or anisotropic etch.

10. The method of claim 2, wherein the forming of the second gate structure in the recess comprises:
   forming a second spacer on sidewalls of the recess;
   forming a second gate dielectric on a base of the recess; and
   forming a second gate conductor on the second gate dielectric.

11. The method of claim 2, wherein the substrate is comprised of silicon.

12. A method of forming a retrograded island comprising:
   providing a substrate having a first semiconductor layer and a second semiconductor layer present on the substrate, wherein a gate structure is present on the second semiconductor layer;
   etching the second semiconductor layer and the first semiconductor layer to expose the substrate using the gate structure as an etch mask, wherein a remaining portion of the first semiconductor layer is present underlying the gate structure;
   forming a first epitaxial semiconductor material on the exposed portions of the substrate;
   forming a source region and drain a region in at least the first epitaxial semiconductor material; removing the substrate to expose the first semiconductor layer;
   etching the first epitaxial semiconductor material selective to the first semiconductor layer to provide first recesses adjacent to each sidewall of the first semiconductor layer;
   forming a dielectric layer on the first recesses that are adjacent to each sidewall of the first semiconductor layer;
   removing the first semiconductor layer to provide a second recess; and
   forming an in-situ doped second epitaxial layer within the second recess to provide the retrograded island.

13. The method of claim 12, wherein the first semiconductor layer comprises a SiGe-containing layer, the second semiconductor layer comprises a Si-containing layer, and the epitaxial semiconductor material comprises a Si-containing layer.

14. The method of claim 13, wherein the gate structure is formed by:
   depositing a gate dielectric on the second semiconductor layer;
   depositing a gate conductor on the gate dielectric;
   forming an etch mask overlying the gate conductor; and
   etching the gate conductor and the gate dielectric selective to the etch mask to provide the gate structure.

15. The method of claim 13, wherein the etching of the silicon-containing layer and the SiGe-containing layer comprises an anisotropic etch process.

16. The method of claim 13, wherein the forming of the epitaxial silicon on the exposed portions of the substrate comprises an epitaxial growth process, wherein the substrate comprises silicon.

17. The method of claim 13, wherein an upper surface of the epitaxial silicon is substantially coplanar with a surface of a remaining portion of the silicon containing layer that is in direct contact with the gate structure.

18. The method of claim 13, wherein the removing of the substrate comprises etching, planarization or separation by ion implantation.

19. The method of claim 13, wherein the forming of the dielectric layer on the first recesses that are adjacent to each sidewall of the first semiconductor layer comprises silicon oxide.

20. The method of claim 19, wherein removing the first semiconductor layer to provide the second recess comprises an etch process that removes the first semiconductor layer selective to the dielectric layer.

21. The method of claim 13, wherein the forming of the in-situ doped second epitaxial layer within the second recess to provide the retrograded island comprises an epitaxial growth process.

* * * * *